United States Patent
Zatelli et al.

(10) Patent No.: US 6,307,229 B2
(45) Date of Patent: *Oct. 23, 2001

(54) NONVOLATILE SEMICONDUCTOR MEMORY DEVICE STRUCTURE WITH SUPERIMPOSED BIT LINES AND SHORT-CIRCUIT METAL STRIPS

(75) Inventors: Nicola Zatelli, Bergamo; Federico Pio, Brugherio; Bruno Vajana, Bergamo, all of (IT)

(73) Assignee: STMicroelectronics, S.r.l., Agrate Brianza (IT)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/081,881

(22) Filed: May 19, 1998

(30) Foreign Application Priority Data

May 20, 1997 (IT) ................................. MI97A1167

(51) Int. Cl.[7] .................... H01L 29/788; H01L 23/48; H01L 23/52; H01L 29/40
(52) U.S. Cl. .................... 257/321; 257/758; 438/263; 438/622
(58) Field of Search .................... 257/321, 758; 438/263, 264, 622

(56) References Cited

U.S. PATENT DOCUMENTS

| | | | | |
|---|---|---|---|---|
| 5,023,681 | * | 6/1991 | Ha | 257/316 |
| 5,889,302 | * | 3/1999 | Li | 257/315 |
| 5,994,733 | * | 11/1999 | Nishioka et al. | 257/316 |

* cited by examiner

*Primary Examiner*—Olik Chaudhuri
*Assistant Examiner*—Howard Weiss
(74) *Attorney, Agent, or Firm*—Theodore E. Galanthay; Ryan Iannucci; Seed IP Law Group, PLLC

(57) ABSTRACT

A nonvolatile semiconductor memory device structure having a matrix of memory cells in a semiconductor material layer. The memory cells are located at intersections of rows and columns of the matrix. Each memory cell includes a control gate electrode connected to one of the rows, a first electrode connected to one of the columns and a second electrode. The rows comprise polysilicon strips extending parallel to each other in a first direction, and the columns are formed by metal strips extending parallel to each other in a second direction orthogonal to the first direction. Short-circuit metal strips are coupled for short-circuiting the second electrodes of the memory cells. The columns and the short-circuit strips are respectively formed in a first metal level and a second metal level superimposed on each other and electrically insulated by a dielectric layer.

21 Claims, 7 Drawing Sheets

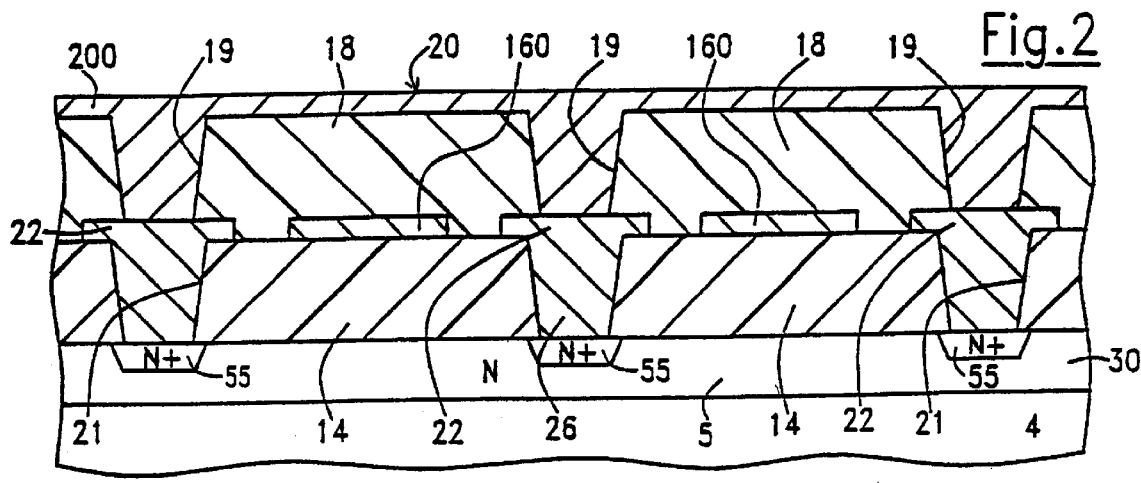
Fig.2
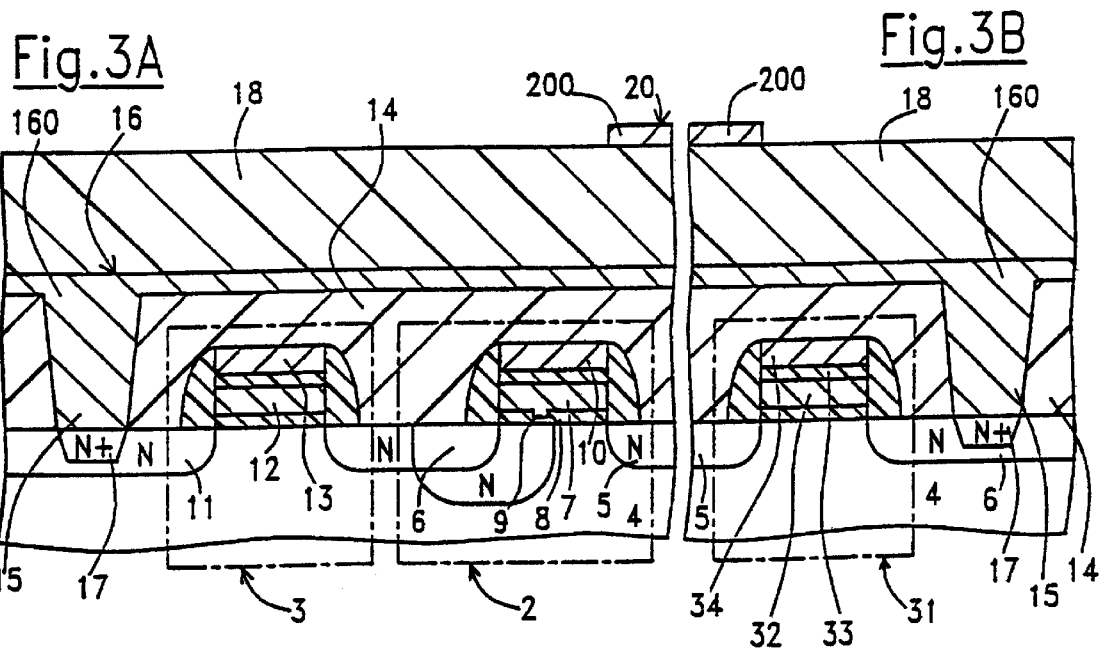
Fig.3A
Fig.3B
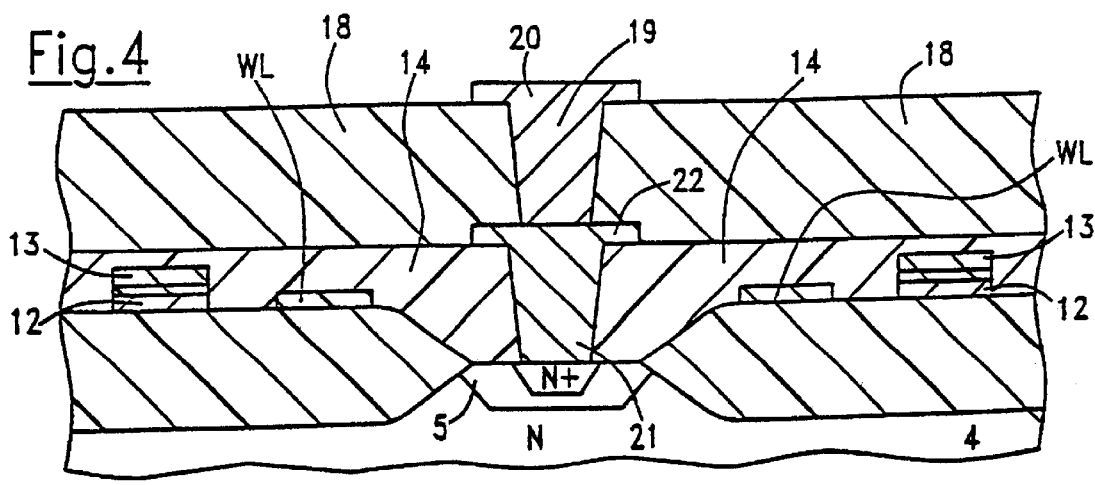
Fig.4

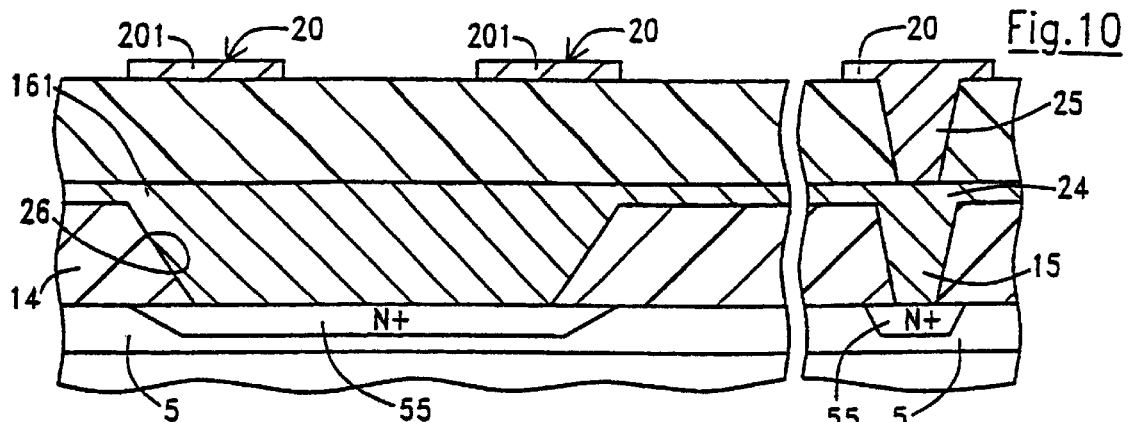
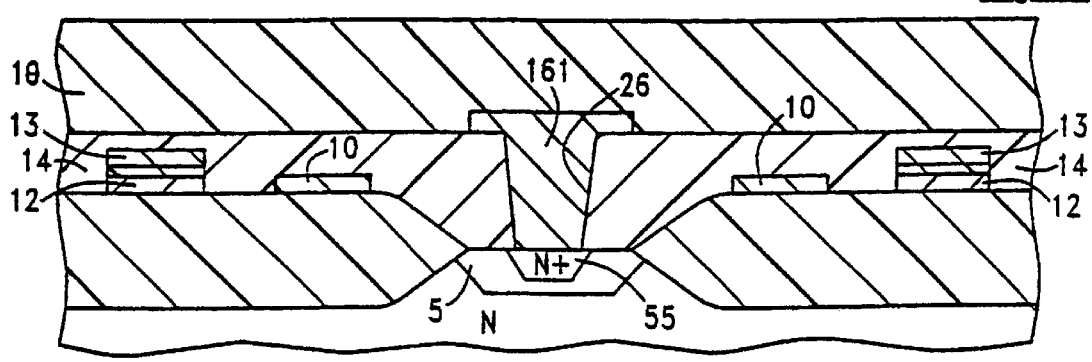
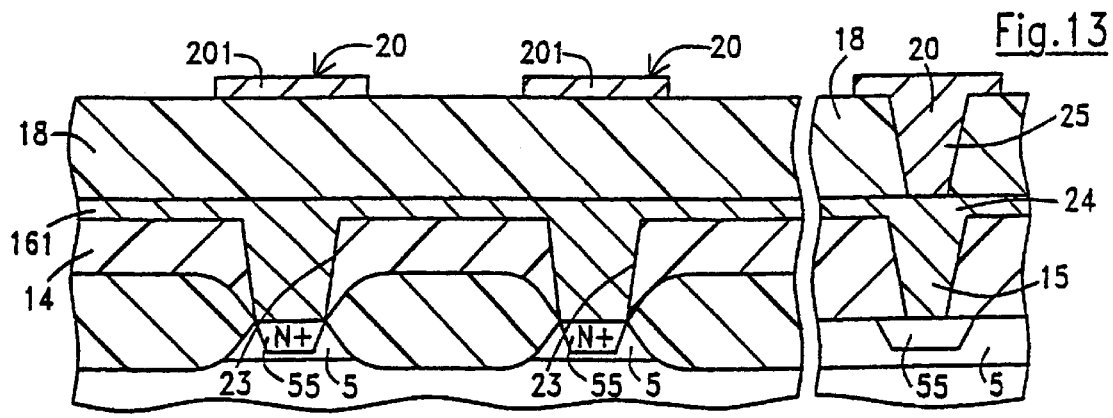
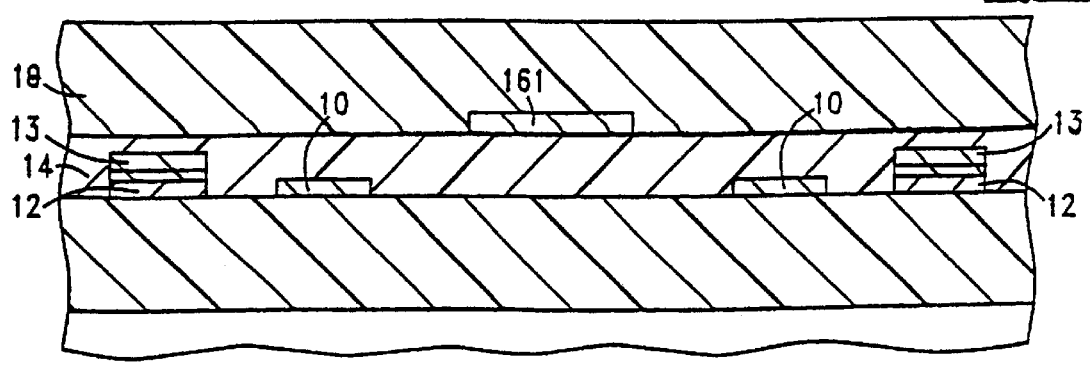

NONVOLATILE SEMICONDUCTOR MEMORY DEVICE STRUCTURE WITH SUPERIMPOSED BIT LINES AND SHORT-CIRCUIT METAL STRIPS

TECHNICAL FIELD

The present invention relates to a nonvolatile semiconductor memory device structure. More specifically, the present invention relates to the structure of electrically programmable nonvolatile semiconductor memory devices, such as for example EPROM, EEPROM and Flash-EEPROM devices.

BACKGROUND OF THE INVENTION

In the family of electrically programmable nonvolatile semiconductor memory devices, FLOTOX (Floating-gate Tunneling Oxide) EEPROM memory devices are known having memory cells comprising floating-gate MOSFETs; an EPROM memory cell is in fact composed of a floating-gate MOSFET and a selection transistor. Each floating-gate MOSFET comprises an N type source region and an N type drain region formed spaced-apart inside a P type semiconductor substrate or well. The portion of the P type substrate or well comprised between the source and drain regions forms a channel region. A floating gate electrode (formed by means of a first level of polysilicon) is placed above the channel region and part of the drain region with the interposition of a gate oxide layer. In correspondence of the drain region, the gate oxide has a thinner area called tunnel oxide. A control gate electrode (formed by means of a second level of polysilicon) is insulatively placed above the floating gate electrode.

The selection transistor of the memory cell is connected in series to a respective floating-gate MOSFET and is used for enabling the memory cell to engage in read and write operations.

Writing of information in the memory cell means the removal of electrons from the floating gate; once the selection transistor is activated, a sufficiently high positive voltage is applied to the drain, while the source is left floating. The control gate and the substrate are kept at ground. Electrons tunnel from the floating gate to the drain. In a written memory cell, during the read operation a current flows in the channel.

In order to erase the datum in the memory cell, the floating gate of the MOSFET is negatively charged by means of the Fowler-Nordheim (F-N) tunneling of electrons from the drain through the tunnel oxide. This is achieved by applying a sufficiently high positive voltage to the control gate of the cell, while the source, the drain and the substrate are kept at ground. In a successive read operation, when the memory cell is selected, no current will flow in the channel.

As known, double polysilicon level FLOTOX EEPROM memory devices comprise a matrix of memory cells (memory matrix) comprising an arrangement of memory cells located at the intersections of rows ("word lines") and columns ("bit lines").

In these devices it is possible to write a single memory cell and to erase groups of eight cells forming a byte of information. The control gates of the eight cells are in fact connected to each other by means of a word line formed by a strip of the second level of polysilicon. The word lines are physically separated for each byte, while the drain regions of the selection transistors of the cells belonging to a same column are connected to each other by means of a bit line generally formed by a metal strip. The source regions of the memory cells are generally formed by a common diffusion for all the cells of the matrix.

During the reading of the memory cells, the read current causes a voltage drop across the source diffusion due to the resistance of thereof. The effective source voltage of the memory cells farther from the contact between the source diffusion and a metal strip supplying the necessary voltages will therefore be different with respect to the cells near the source contact, due to the aforementioned voltage drop, and this alters the parameters for deciding if the information is stored in the memory or not, thus reducing the memory reliability.

This drawback is more evident in EEPROM memories providing for parallel read. in which at each read operation eight cells are selected. However, this problem also affects serial-reading EEPROM memory devices or memory devices different from EEPROM, such as for example the EPROM or Flash-EEPROM memory devices, which are also formed in matrix form and wherein each memory cell comprises a floating-gate MOSFET formed in a P type substrate or well wherein an N type source region and an N type drain region are implanted in a spaced-apart way so as to form a channel region, a floating gate electrode is disposed over the channel with the interposition of an oxide layer, and a control gate electrode is insulatively located above the floating gate electrode. The drain regions of the floating-gate MOSFETs are directly connected to respective bit lines, and a single source diffusion connects all the memory cells. Also in this case, the voltage drop across the source diffusion makes the effective source voltage of the memory cells different from cell to cell.

SUMMARY OF THE INVENTION

According to principles of the present invention, a nonvolatile semiconductor memory device is provided haviing a structure substantially eliminating voltage drops across a source diffusion in order to improve the reliability of memory cells in reading. The voltage drops are eliminated without substantially increasing the area of the memory device.

According to embodiments of the present invention, a nonvolatile semiconductor memory device structure is provided having a matrix of memory cells formed in a semiconductor material layer and located at intersections of rows and columns of the matrix, each cell having a control gate electrode connected to one of the rows, a first electrode connected to one of the columns and a second electrode. The rows comprise polysilicon strips extending parallel to each other in a first direction, and the columns are formed by metal strips extending paralle to each other in a second direction orthogonal to the first direction. The memory device includes short-circuit metal strips for short-circuiting the second electrodes of the memory cells, the columns and the short-circuit strips being respectively formed in a first and a second metal level superimposed on each other and electrically insulated by a dielectric layer.

Thanks to the embodiments of the present invention it is possible to eliminate voltage drops across a source diffusion, assuring an effective control of a source voltage of each memory cell during reading.

BRIEF DESCRIPTION OF THE DRAWINGS

The features of the embodiments of the present invention will be made more apparent by the following detailed description of four embodiments thereof, illustrated as non-limiting examples in the annexed drawings, wherein:

FIG. 2 is a cross-sectional view along a line II—II in FIG. 1.

FIG. 3A is a cross-sectional view along line a III—III in FIG. 1.

FIG. 3B is a cross-sectional view similar to that of FIG. 3A, but relates to semiconductor memory devices formed with EPROM or Flash-EEPROM memory cells.

FIG. 4 is a cross-sectional view along a line IV—IV in FIG. 1.

FIG. 10 is a cross-sectional view along a line X—X in FIG. 9.

FIG. 11 is a cross-sectional view along a line XI—XI in FIG. 9.

FIG. 13 is a cross-sectional view along a line XIII—XIII in FIG. 12.

FIG. 14 is a cross-sectional view along a line XIV—XIV in FIG. 12.

DETAILED DESCRIPTION OF THE INVENTION

Figure 1:
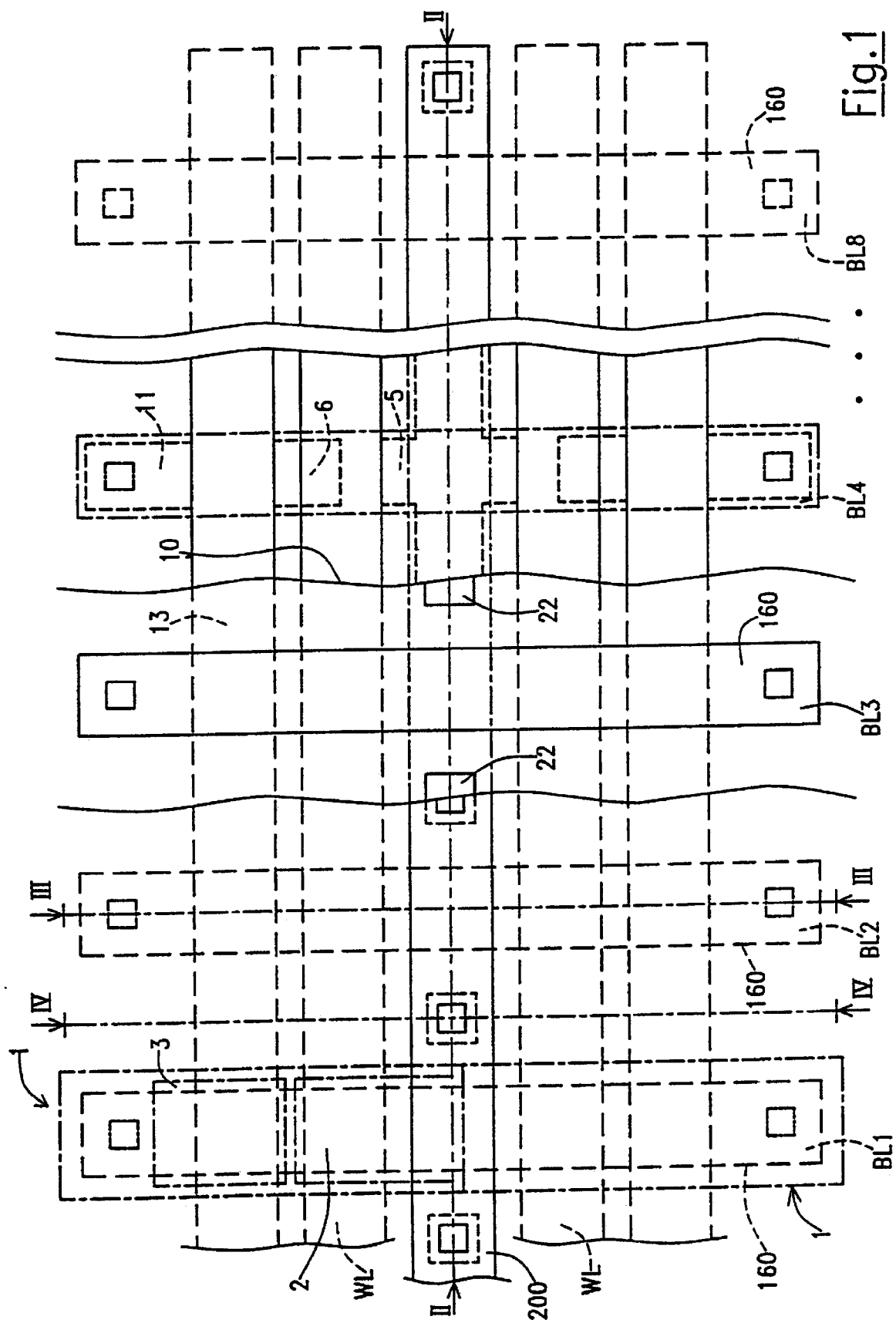
FIG. 1 is a top-plan view of a nonvolatile semiconductor memory device structure according to a first embodiment of the invention, relating for example to an EEPROM memory device.
Figure 5:
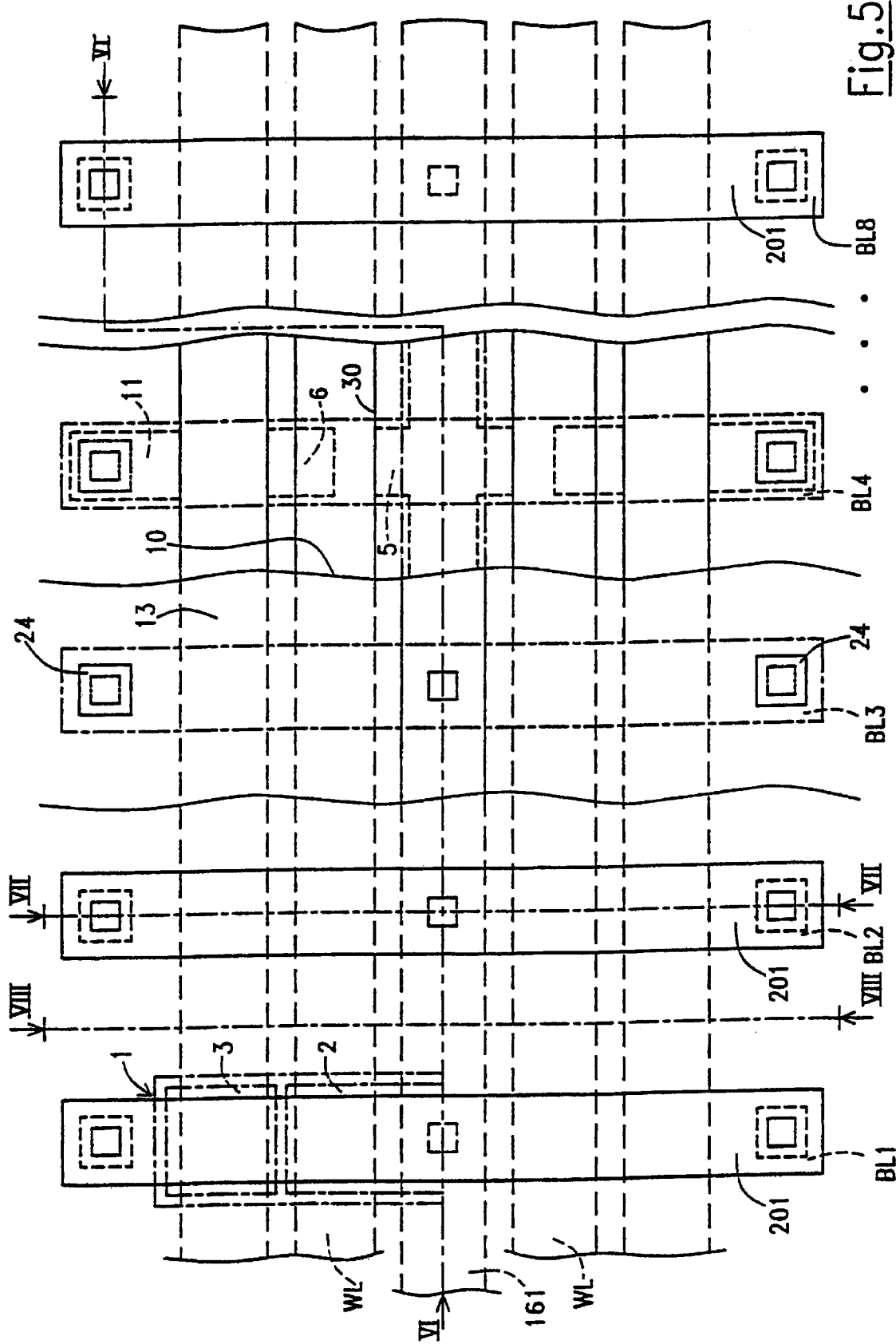
FIG. 5 is a top-plan view of a nonvolatile semiconductor memory device structure according to a second embodiment of the invention, relating for example to an EEPROM memory device.
Figure 6:
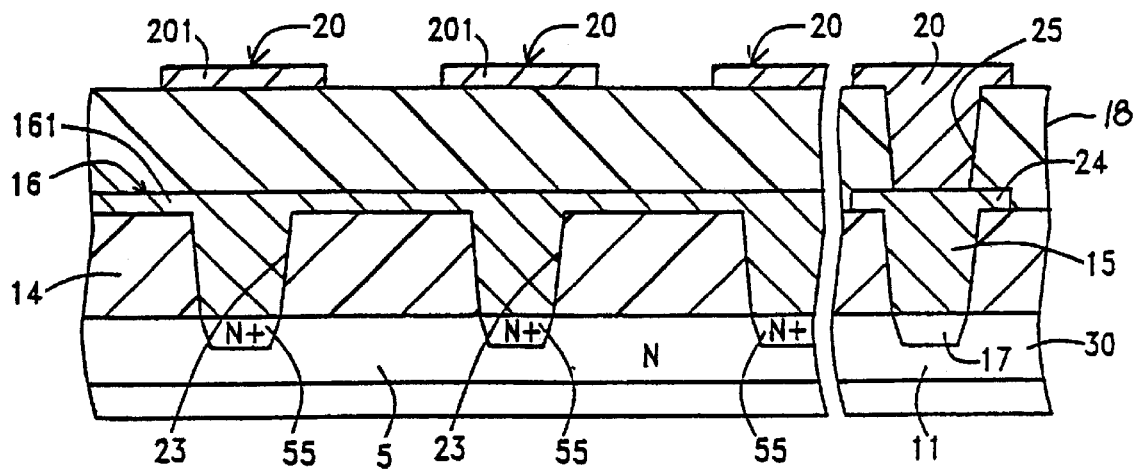
FIG. 6 is a cross-sectional view along a line VI—VI of FIG. 5.

A first embodiment of the present invention is shown in FIGS. 1–4. FIG. 1 is a top-plan view partially sectioned along different planes of a portion of a memory matrix of a nonvolatile semiconductor memory device according to a first embodiment of the present invention, specifically for a FLOTOX EEPROM device. The memory matrix comprises an arrangement of memory cells 1 disposed in rows (word lines) WL and columns (bit lines) BL1–BL8. The portion of matrix shown in FIG. 1 comprises sixteen memory cells 1 symmetrically arranged with respect to a plane indicated by lines II—II. The sixteen memory cells 1 form two groups of eight cells (two bytes) for storing information.

Referring to FIG. 3A, each memory cell 1 comprises a floating-gate MOSFET 2 and a selection transistor 3. For each MOSFET 2, in a P type substrate or well 4 an N type source region 5 and an N type drain region 6 are implanted in a spaced-apart way. A portion of the substrate or well 4 comprised between the regions 5 and 6 forms a channel region and a floating gate electrode 7 is located over the channel region and part of the drain region 6, with the interposition of a gate oxide layer 8 having a thinner portion 9 (tunnel oxide) in correspondence of the drain region 6 so as to allow the passage by tunnel effect of electrons from the drain region 6 to the floating gate electrode 7 and vice-versa when the information is stored in the memory cells 1.

A control gate electrode 10 is insulatively placed over the floating gate electrode 7.

As appears from FIGS. 1 and 2. the source regions 5 of the MOSFETs 2 of the two groups of memory cells belong to a common source diffusion 30, so that the source active area of each cell has a substantially "T" shape.

In series to each MOSFET 2 a selection transistor 3 is connected, having an N type source region coinciding with the drain region 6 of the MOSFET 2, and therefore having the same reference numeral 6, and a drain region 11 formed in the P type substrate or well 4. The substrate or well 4 comprised between the drain region 11 and the source region 6 forms a channel region, over which two superimposed polysilicon electrodes 12, 13 are placed with the interposition of different layers of oxide, so as to form a gate of the selection transistor 3. The two polysilicon electrodes 12, 13 for the selection transistor 3 belong to respective lines formed from a first and a second polysilicon level, and the lines are electrically short-circuited in a zone of the matrix not shown in FIG. 1.

The floating gate electrode 7 of each of the MOSFETs 2 of the memory cells 1 is formed by definition of the first level of polysilicon while each control gate electrode 10 of the MOSFETs 2 of the memory cells 1 of each one of the groups of cells is formed by means of a respective line formed in the second level of polysilicon, the line forming a word line WL.

Over the whole surface of the memory device an intermediate dielectric layer 14 is successively grown, in which openings 15 are then formed. A lower metal level 16 is then deposited for forming metal lines 160 which contact, through the openings 15, the drain regions 11 of the respective selection transistors 3 through more heavily doped N+ regions 17.

Lines 160 form the bit lines BL1–BL8 each of which connects the drain region 11 of the selection transistors 3 of two facing memory cells 1.

As shown in FIG. 2, in the intermediate dielectric layer 14 further openings 21 are formed for metal isles 22, obtained in the lower metal level 16, the metal isles 22 contacting through the openings 21 the source diffusion 30 by means of more heavily doped N type regions 55.

Over the lower metal level 16 an internetal dielectric layer 18 is subsequently formed.

Further openings 19 are formed in the dielectric layer 18 in correspondence of the metal isles 22. An upper metal level 20 is then deposited, in order to form a source short-circuit strip 200 that, through the openings 19, contacts the metal isles 22.

FIG. 1 shows the source short-circuit strip 200 that extends parallel to the word lines WL and orthogonally to the bit lines BL1–BL8 160 formed in the lower metal level 16.

From FIG. 2 it is apparent that the contacts of the source short-circuit strip 200 to the source diffusion 30 are periodically arranged and there arc two contacts for each pair of facing memory cells 1.

Thanks to the presence of short-circuit strips 200, each having a very low resistivity, and to the fact that the source diffusion 30 is short-circuited at each memory cell, the source regions 5 of all the memory cells 1 can be kept substantially at the same potential.

FIG. 4 shows a cross-section along a line IV—IV showing a plane parallel to the bit lines BL passing through the source contact. It is possible to see the word line WL connecting the control gate electrode 10 of the different MOSFETs 2 of the memory cells 1 of one of the two groups of memory cells, and the two polysilicon strips 12, 13 forming the gate of the selection transistors 3.

Another memory device according to a second embodiment of the present invention is shown in FIGS. 5–8.

Also in this embodiment each memory cell 1, as shown in FIG. 1, comprises a floating-gate MOSFET 2 and a selection transistor 3 which are formed in the same way as in the embodiment of the invention shown in FIG. 1. The embodiments of the inventions shown in FIGS. 1–8 have similar elements and regions which are given the same reference numerals for purposes of brevity.

Over the whole surface of the memory device an intermediate oxide layer 14 is grown in which first openings 23 and second openings 15 are formed.

By means of a lower metal level 16 metal isles 24 are formed which contact drain regions 11 of selection transistors 3 of Lhe memory cells 1 through openings 15 and more heavily doped N type regions 17, and a source short-circuit line 161 contacting a source diffusion 30 through openings 23 and N+ regions 55.

An intermetal dielectric layer 18 is subsequently grown, and openings 25 are formed therein in correspondence of the metal isles 24. By means of an upper metal level 20 bit lines 201 are formed, which contact the underlying metal isles 24 through the openings 25.

In this second embodiment. for each memory cell 1 (more precisely, for each pair of facing memory cells) one contact is provided between the source shortcircuit line 161 and the source diffusion 30, and the contact is provided under each bit line 201 instead of in a space comprised between adjacent bit lines. This arrangement allows to obtain a more compact structure in the direction of the word lines WL.

Figure 9:
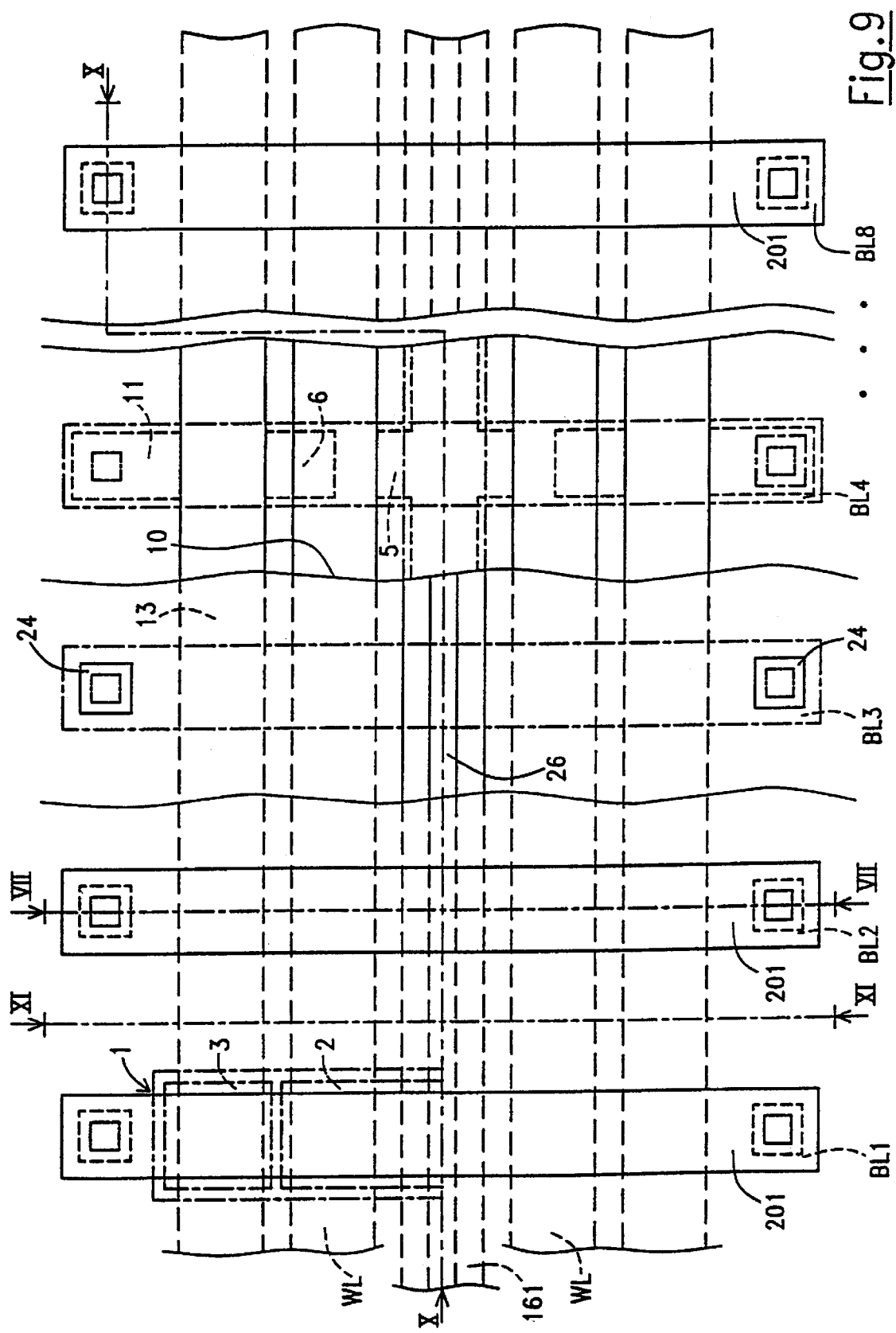
FIG. 9 is a top-plan view of a nonvolatile semiconductor memory device structure according to a third embodiment of the invention, relating for example to an EEPROM memory device.

A third embodiment of the invention is shown in FIGS. 9–11. The embodiments of the inventions shown in FIGS. 1–4 and 9–11 have similar elements and regions which are given the same reference numerals for purposes of brevity.

This embodiment differs from the previous one because a single opening 26 is formed in a dielectric layer 14, over a source diffusion 30 (FIGS. 10 and 11).

This embodiment has the advantage of allowing for a reduction of the dimension of the opening 26 in a direction parallel to the bit lines BL, being much greater the extension of the openings in a direction parallel to the word lines WL.

Figure 12:
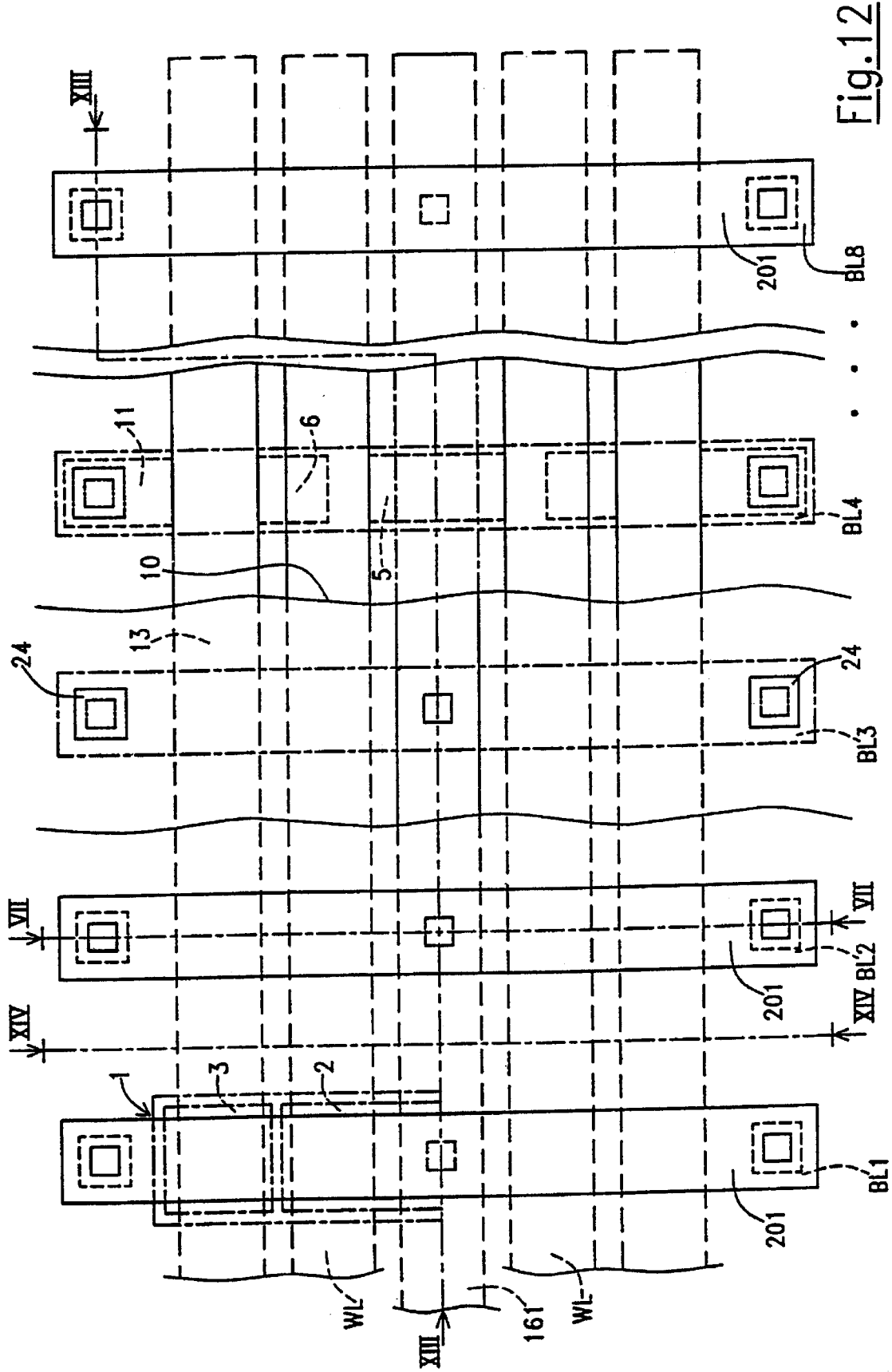
FIG. 12 is a top-plan view of a nonvolatile semiconductor memory device structure according to a fourth embodiment of the invention, relating for example to an EEPROM memory device.

A fourth embodiment of the invention is shown in FIGS. 12 to 14. The embodiments of the inventions shown in FIGS. 1–4 and 12–14 have similar elements and regions which are given the same reference numerals for purposes of brevity.

As appears from FIG. 13, differently from the previous embodiments, no continuous source diffusion 30 is provided for connecting source regions 5 of memory cells 1. The source regions 5 of pairs of facing memory cells 1 are distinct from those of the other pairs of memory cells 1. The source active area of a generic memory cell 1 has therefore an "I" shape instead of a "T" shape, and each source contact is shared by two facing memory cells 1.

As in the second embodiment of the invention shown in FIGS. 5–8, a source short-circuit line 161 is formed by means of a lower metal level 16, and contacts the source regions 5 of pairs of facing memory cells 1 through openings 23 in a dielectric layer 14 and N+ regions 55.

Considering the particular structure of the embodiments of the invention shown in FIGS. 1–14, the Funnel effect is completely avoided, that is due to the widening of the active area under the floating gate electrode 7 caused by the photolithographic resolution of the manufacturing process and the growth of field oxide at the corners. The capacitive coupling is additionally rendered more uniform, and misalignments between the polysilicon mask and the active area mask are not influent.

The described structure can be advantageously used for EEPROM memories with serial architecture, or EPROM or Flash-EEPROM memory devices.

Figures 7A, 7B:
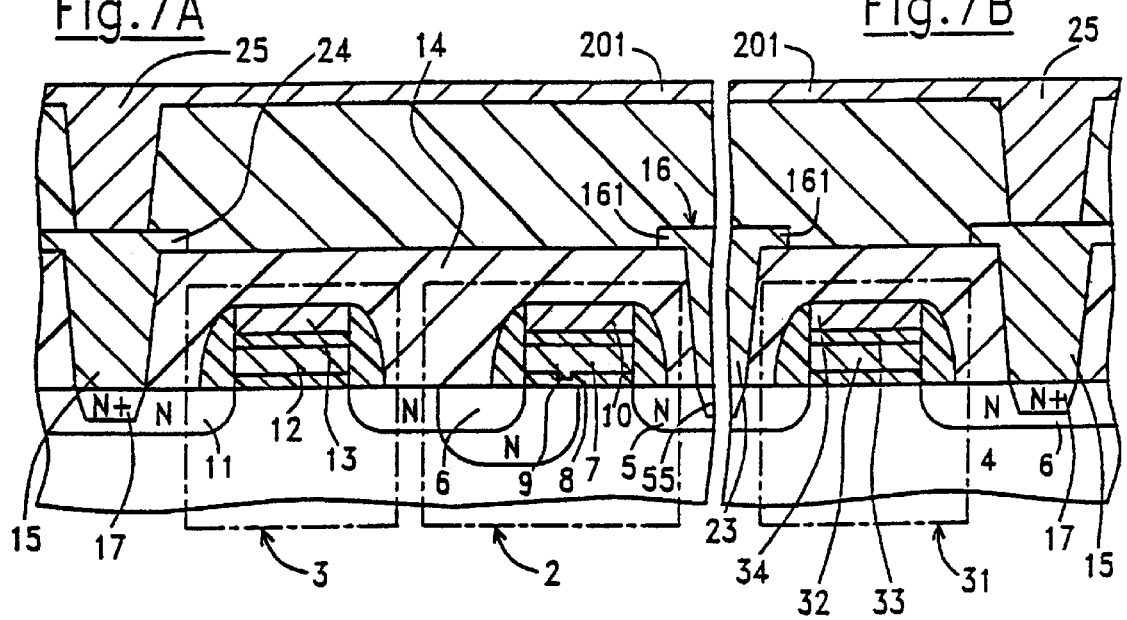
FIG. 7A is a cross-sectional view along a line VII—VII in FIG. 5.
FIG. 7B is a cross-sectional view similar to that of FIG. 7A, but relates to semiconductor memory devices with EPROM or Flash-EEPROM memory cells.
Figure 8:
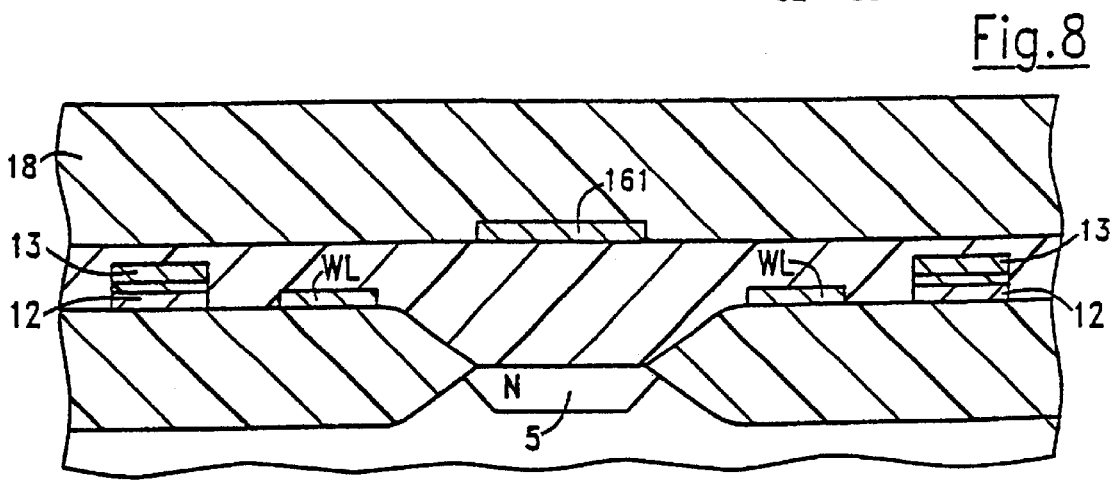
FIG. 8 is a cross-sectional view along a life VIII—VIII in FIG. 5.

FIGS. 3B, 7B are similar to FIGS. 3A, 7A, but relate to an EPROM or a Flash-EEPROM memory device. Similar regions and elements have been given similar reference numerals. In these figures an EPROM or a Flash-EEPROM memory cell 1 is shown, the memory cell 1 comprising a floating-gate MOSFET 31 formed in a P type substrate or well 4 wherein an N type source region 5 and an N type drain region 6 are implanted so as to be spaced apart from each other. The portion of the substrate or well 4 comprised between the regions 5 and 6 forms a channel region, and a floating gate electrode 32 is located above the channel region with the interposition of an oxide layer 33. A control gate electrode 34 is insulatively located over the floating gate electrode 32. Differently from the EEPROM memories, no selection transistor is provided.

Also in the case of EPROM and Flash-EEPROM memories, the fact of providing source short-circuit lines 200, 161 contacting a source diffusion 30, 5 in several points improves the reliability of the memory device and reduces the dispersion of the value of the read current, especially for parallel access devices, the dispersion being caused by the voltage drop across the portions of the source diffusion 30 (a voltage drop which is higher or lower depending on the length of such diffusion).

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A semiconductor memory device comprising:
    a plurality of memory cells arranged in a matrix of rows and columns, each memory cell being located at an intersection of one of the rows and one of the columns, each memory cell having a control terminal coupled to one of the rows, a first terminal electrically coupled to one of the columns, and a second terminal; and
    a plurality of conductive strips permanently electrically connected to the second terminals of the memory cells and coupled to a reference voltage, the conductive strips and columns being superimposed over each other, wherein the columns are conductive lines that extend in a first direction and the conductive strips extend primarily in a second direction orthogonal to the first direction.

2. A semiconductor memory device comprising:
    a plurality of memory cells arranged in a matrix of rows and columns, each memory cell being located at an intersection of one of the rows and one of the columns, each memory cell having a control terminal coupled to one of the rows, a first terminal electrically coupled to one of the columns, and a second terminal; and a plurality of conductive strips permanently in ohmic contact with the second terminals of the memory cells and coupled to a reference voltage, the conductive strips and columns being superimposed over each other.

3. The semiconductor memory device of claim 1 wherein the conductive strips are coupled together and to a ground voltage reference to couple the ground voltage reference to the second terminals of the memory cells.

4. The semiconductor memory device of claim 3 wherein the columns are comprised of metal and are formed in a first direction in a first metal level of the semiconductor memory device.

5. The semiconductor memory device of claim 4 wherein the conductive strips are comprised of metal and are formed in a second metal level of the semiconductor memory device, the second metal level being superimposed on the first metal level and being separated from the first metal level by a dielectric layer.

6. The semiconductor memory device of claim 5 wherein the rows are comprised of polysilicon and are formed in a second direction orthogonal to the first direction.

7. semiconductor memory device of claim 6 wherein the first metal level is disposed below the second metal level and the dielectric layer.

8. The semiconductor memory device of claim 6 wherein the first metal level is disposed above the second metal level and the dielectric layer.

9. A nonvolatile semiconductor memory device comprising;

a matrix of memory cells formed in a semiconductor material layer, the memory cells being located at intersections of rows and columns of the matrix, each memory cell comprising a control gate electrode connected to one of said rows, a first electrode electrically connected to one of said columns, and a second electrode, said rows comprising polysilicon strips extending parallel to each other in a first direction, said columns being formed by metal strips extending parallel to each other in a second direction orthogonal to said first direction; and a plurality of short-circuit metal strips permanently electrically connected to the second electrodes of the memory cells, said columns and said shortcircuit metal strips being respectively formed in a first metal level and a second metal level superimposed on each other and electrically insulated from each other by a dielectric layer.

10. The nonvolatile semiconductor memory device of claim 9 wherein said first metal level is located under said second metal level and said dielectric layer.

11. The nonvolatile semiconductor memory device of claim 10, further comprising:

a plurality of metal isles in said first metal level contacting said second electrodes of the memory cells; and openings formed in the dielectric layer corresponding to said metal isles through which said short-circuit metal strips contact said metal isles.

12. The nonvolatile semiconductor memory device of claim 11 wherein said first metal level is isolated from said semiconductor material layer by a further dielectric material layer, said metal isles being in contact with said second electrodes of the memory cells through further openings formed in said further dielectric material layer.

13. The nonvolatile semiconductor memory device of claim 12 wherein said second electrodes of the memory cells are coupled to a common diffusion for said second electrodes extending orthogonally to said columns, said further openings and said metal isles being interposed in said columns.

14. The nonvolatile semiconductor memory device of claim 9 wherein said first metal level is above said second metal level and said dielectric layer.

15. The nonvolatile semiconductor memory device of claim 14, further comprising:

a plurality of metal isles in said second metal level that contact the first electrodes of respective memory cells; and openings formed in the dielectric layer corresponding to said metal isles through which said columns contact said metal isles.

16. The nonvolatile semiconductor memory device of claim 15 wherein the second metal level is isolated from said semiconductor material layer by a further dielectric material layer, said metal isles being in contact with said first electrodes of the memory cells through further openings formed in said further dielectric material layer.

17. The nonvolatile semiconductor memory device of claim 14, further comprising further openings formed in a further dielectric material layer between the second metal level and the semiconductor material layer, said short-circuit metal strips being in contact with said second electrodes through said further dielectric material layer.

18. The nonvolatile semiconductor memory device of claim 17 wherein said second electrodes of the memory cells are coupled to a common diffusion for said second electrodes extending orthogonally to said columns.

19. The nonvolatile semiconductor memory device of claim 18 wherein said further openings are formed in correspondence to said columns.

20. The nonvolatile semiconductor memory device of claim 18 wherein said further openings in said further dielectric material layer extend in said first direction above said common diffusion.

21. The nonvolatile semiconductor memory device of claim 17 wherein said second electrodes of the memory cells are coupled to the common diffusion in common with pairs of memory cells, and wherein said further openings are formed in correspondence to said columns.

* * * * *